(12) United States Patent
Tseng

(10) Patent No.: US 11,183,391 B2
(45) Date of Patent: Nov. 23, 2021

(54) METHOD FOR REAL TIME MONITORING SEMICONDUCTOR FABRICATION PROCESS

(71) Applicant: TAIWAN SEMICONDUCTOR MANUFACTURING CO., LTD., Hsinchu (TW)

(72) Inventor: Lee-Chuan Tseng, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/816,937

(22) Filed: Mar. 12, 2020

(65) Prior Publication Data

US 2021/0125835 A1 Apr. 29, 2021

Related U.S. Application Data

(60) Provisional application No. 62/927,296, filed on Oct. 29, 2019.

(51) Int. Cl.
*H01J 37/32* (2006.01)
*H01L 21/3065* (2006.01)
*H01L 21/311* (2006.01)

(52) U.S. Cl.
CPC .......... *H01L 21/3065* (2013.01); *H01J 37/32* (2013.01); *H01L 21/31144* (2013.01); *H01J 37/32963* (2013.01); *H01J 2237/3151* (2013.01)

(58) Field of Classification Search
CPC ........... H01L 21/3065; H01L 21/31144; H01L 21/67017; H01L 21/6719; H01L 21/67253; H01J 22/00; H01J 37/32; H01J 2237/3151; H01J 37/32963
USPC ............ 438/706, 710, 712, 714; 156/345.25, 156/345.26
See application file for complete search history.

(56) References Cited

U.S. PATENT DOCUMENTS

| | | | |
|---|---|---|---|
| 6,192,898 B1 * | 2/2001 | Aitani | C23C 16/4405 134/1.1 |
| 6,358,327 B1 * | 3/2002 | Pokharna | C23C 16/4405 134/1.1 |
| 6,868,856 B2 * | 3/2005 | Nowak | B08B 7/00 134/1 |
| 9,574,267 B2 * | 2/2017 | Nozawa | C23C 16/50 |
| 2006/0096705 A1 * | 5/2006 | Shi | H01L 21/31116 156/345.33 |
| 2013/0228698 A1 * | 9/2013 | Kakutani | H01J 27/24 250/423 P |
| 2015/0235816 A1 * | 8/2015 | Yun | H01J 37/32963 156/345.25 |

* cited by examiner

*Primary Examiner* — Lan Vinh
(74) *Attorney, Agent, or Firm* — Birch, Stewart, Kolasch & Birch, LLP

(57) ABSTRACT

A method for processing semiconductor wafer is provided. The method includes supplying a processing gas into an etching chamber containing a semiconductor wafer. The method also includes detecting a pressure in the etching chamber. The method further includes regulating an exhaust flow from the etching chamber by adjusting an open ratio of a valve according to a data in relation to a pressure in the etching chamber produced by the pressure sensor. In addition, the method includes determining an etching endpoint based on the open ratio of the valve.

20 Claims, 13 Drawing Sheets

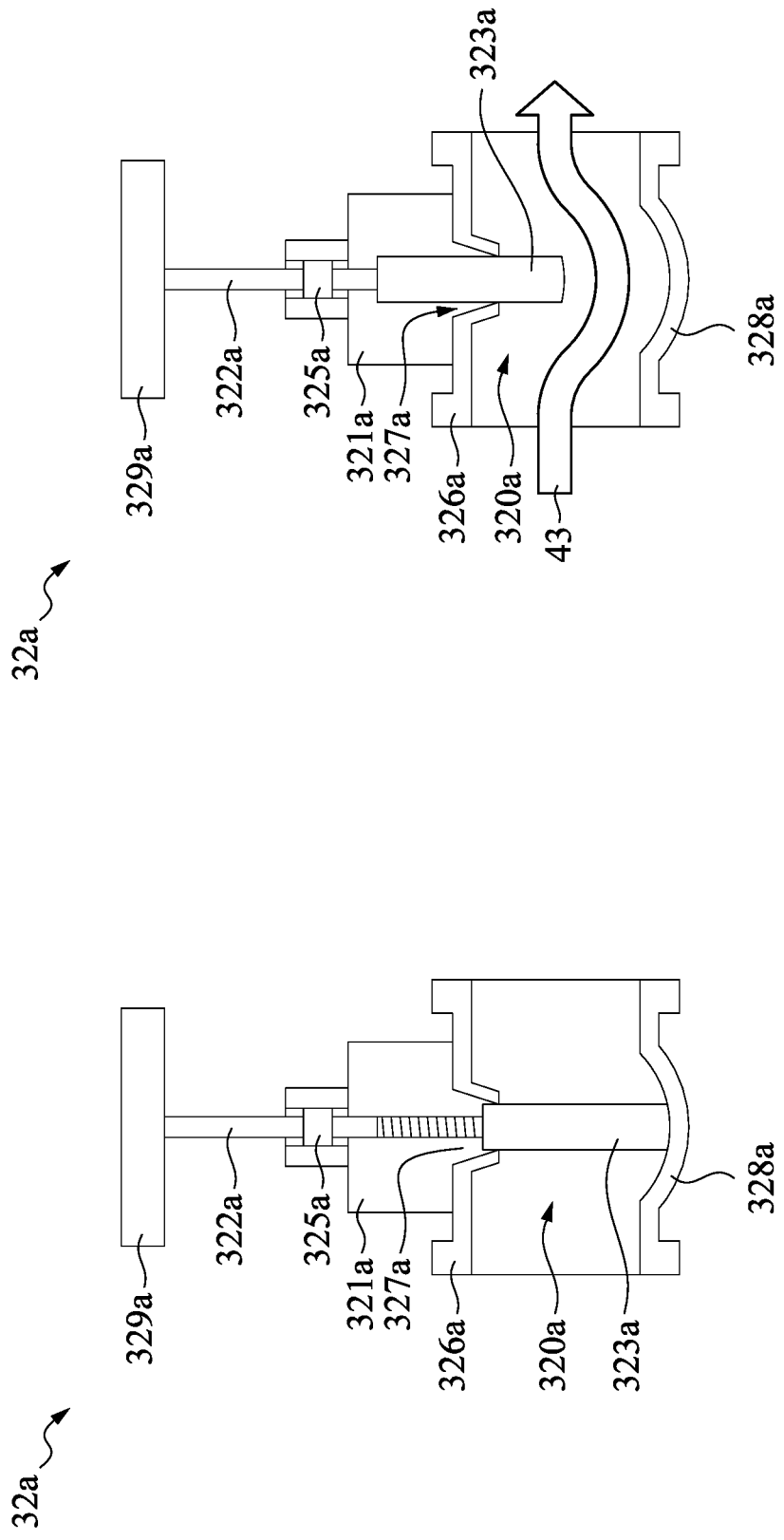

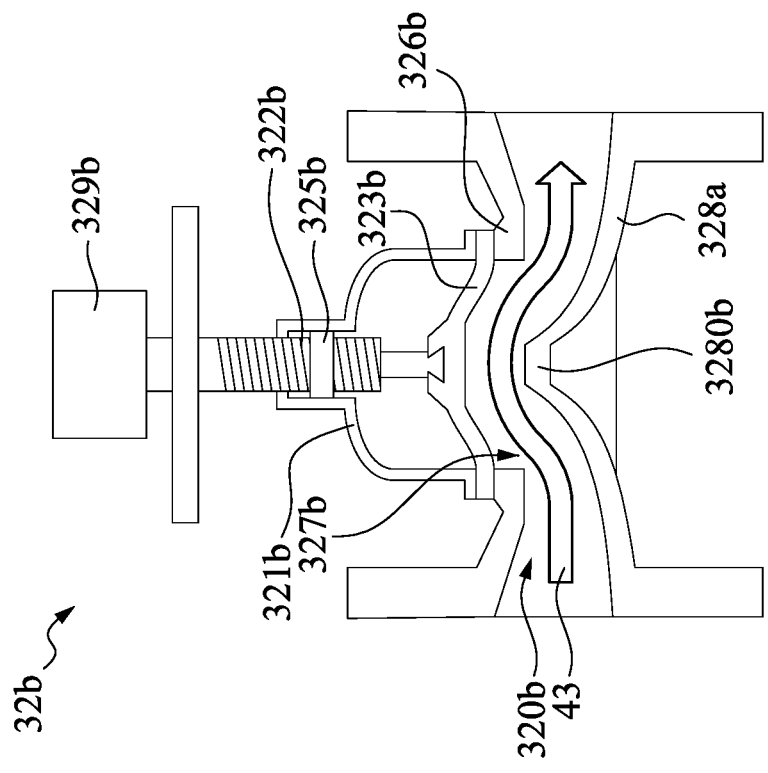
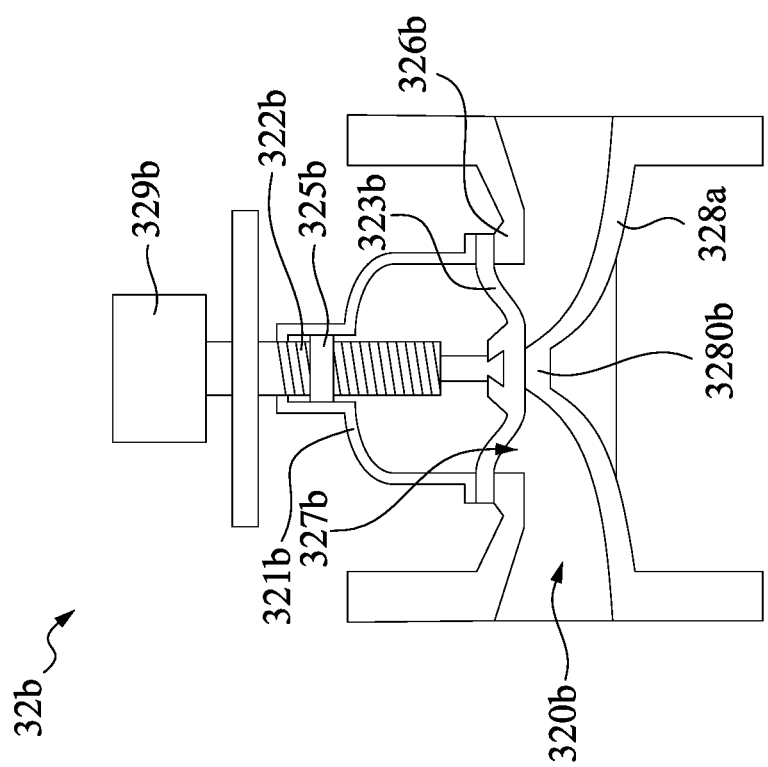
Fig. 5A
Fig. 5B

METHOD FOR REAL TIME MONITORING SEMICONDUCTOR FABRICATION PROCESS

PRIORITY CLAIM AND CROSS-REFERENCE

This application claims the benefit of U.S. Provisional Application No. 62/927,296, filed on Oct. 29, 2019, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

In the fabrication and processing of semi-conductor devices, such as silicon wafers, a variety of different semiconductor equipment and/or tools are utilized. These tools and equipment are well-known in the art, and include for example, photolithographic machines, etchers, deposition equipment, furnaces, as well as a variety of sensors and control equipment. Although the capabilities of these types of semi-conductor processing equipment have improved over the years, the technique of monitoring the ongoing process has not necessarily kept pace with the improvements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A shows a cross-sectional view of a valve in which an exhaust flow is blocked by a disc of the valve as an open ratio of the valve is 0, in accordance with some embodiments.

FIG. 4B shows a cross-sectional view of a valve in which an exhaust flow passes through a channel of the valve as an open ratio of the valve is greater than 0, in accordance with some embodiments.

FIG. 5A shows a cross-sectional view of a valve in which an exhaust flow is blocked by a diaphragm of the valve as an open ratio of the valve is 0, in accordance with some embodiments.

FIG. 5B shows a cross-sectional view of a valve in which an exhaust flow passes through a channel of the valve as an open ratio of the valve is greater than 0, in accordance with some embodiments.

DETAILED DESCRIPTION

Figure 1:
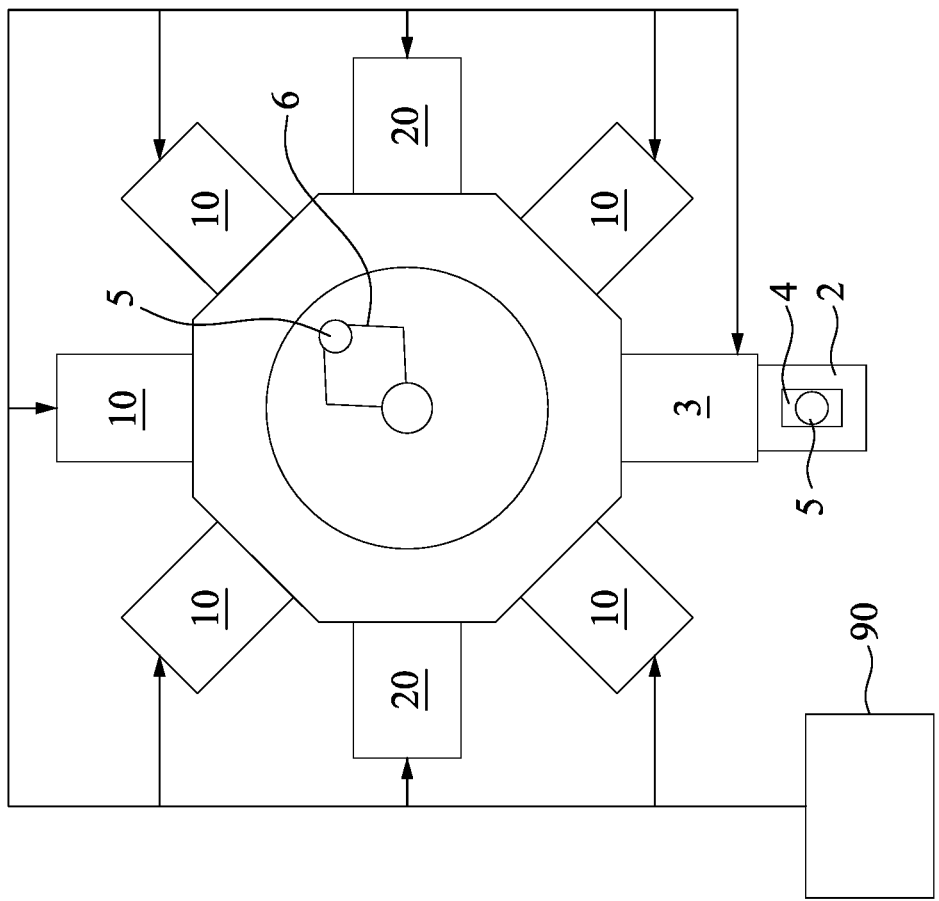
FIG. 1 shows a schematic view of a wafer fabricating system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device fabrication includes many different processes. One of the processes involved in manufacturing semiconductor devices is etching. A number of etching technologies may be employed, such as chemical dry etching (also called vapor phase etching) does not use liquid chemicals or etchants. This process involves a chemical reaction between etchant gases to attack the silicon surface. The chemical dry etching process is usually isotropic and exhibits high selectively. Different with a plasma etching process, in which endpoint is determined based on a level of intensity of the plasma, the chemical dry etching process has not yet developed a method of determining an endpoint. Therefore, the chemical dry etching process often takes longer than actually needed, which ultimately results in either reduction in tool availability or increase in processing gas usage. To address this issue, the present disclosure provides a wafer fabricating system and method for determining an endpoint for a chemical dry etching process. In one exemplary embodiment, the endpoint is determined based on an open ratio of a valve which may be varied a composition of an exhaust gas passing thereby.

FIG. 1 shows a schematic diagram of one embodiment of a wafer fabricating system 1 for processing a semiconductor wafer 5, in accordance with some embodiments. The wafer fabricating system 1 in FIG. 1 includes a load port 2, a load lock chamber 3, a robot 6, a number of processing tools 10, one or more metrology chambers 20 and a control module 90.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The load port 2 is configured to support and dock the wafer carrier 4 for facilitating the insertion of semiconductor wafer 5 into, and their subsequent removal from, wafer fabricating system 1. The wafer carrier 4 is configured to transport a number of semiconductor wafers, e.g., 6 wafers, 12 wafers, 24 wafers, etc. The wafer carrier 4 may be standard mechanical interfaces (SMIFs) for loading semiconductor wafers each having a diameter of 200 mm. Alternatively the wafer carrier 4 may be front opening unified pods (FOUPs), which may be used to load 300 mm or 450 mm semiconductor wafers, or semiconductor wafers with larger diameters. Other types and/or sizes of wafer carrier or pod are, however, not excluded.

The load lock chamber 3 is arranged between the wafer fabricating system 1 and the load port 2. The load lock chamber 3 is configured for preserving the atmosphere within the wafer fabricating system 1 by separating it from the outside environment. When the semiconductor wafer 5 from the wafer carrier 4 is inserted into the load lock chamber 3, doors of the load lock chamber 3 are sealed. As a result, an air-tight environment is built in the load lock chamber 3. The load lock chamber 3 is capable of creating an atmosphere compatible within the wafer fabricating system 1. This can be performed by altering the gas content of the load lock chamber 3 by creating a vacuum. When the correct atmosphere has been reached, the semiconductor wafer 5 can be accessed by the robot 6. The robot 6 transfers the wafer among the load lock chamber 3, the processing tools 10, and the metrology chambers 20. In one exemplary embodiment, the robot 6 is operable to position and place the semiconductor wafer 5 into the processing tool 10 prior to the chemical etching process, and remove the semiconductor wafer 5 from the processing tool 10 after the chemical etching process.

The processing tools 10 are equipped to perform one or more of numerous processes or treatments, such as plasma processes, chemical vapor deposition (CVD), atomic layer deposition (ALD), physical Vapor Deposition (PVD), annealing, dry etching, degassing, pre-cleaning, cleaning, post-cleaning, etc. The metrology chambers 20 are configured to measure various properties of wafers before or after processing. In some embodiments, one or more metrology chambers 20 is/are integrated in one or more of the processing tools 10. While five processing tools 10 and two metrology chambers 20 are shown, other numbers of processing tools 10 and/or metrology chambers 20 are within the scope of this disclosure. Likewise, in some embodiments, more than one robot 6 and/or load lock chamber 3 are included in the processing tools 10. The control module 90 is configured to control wafer measurement, transfer and processing. Details of the control module 90 will be described further below in respect to FIG. 6.

Figure 2:
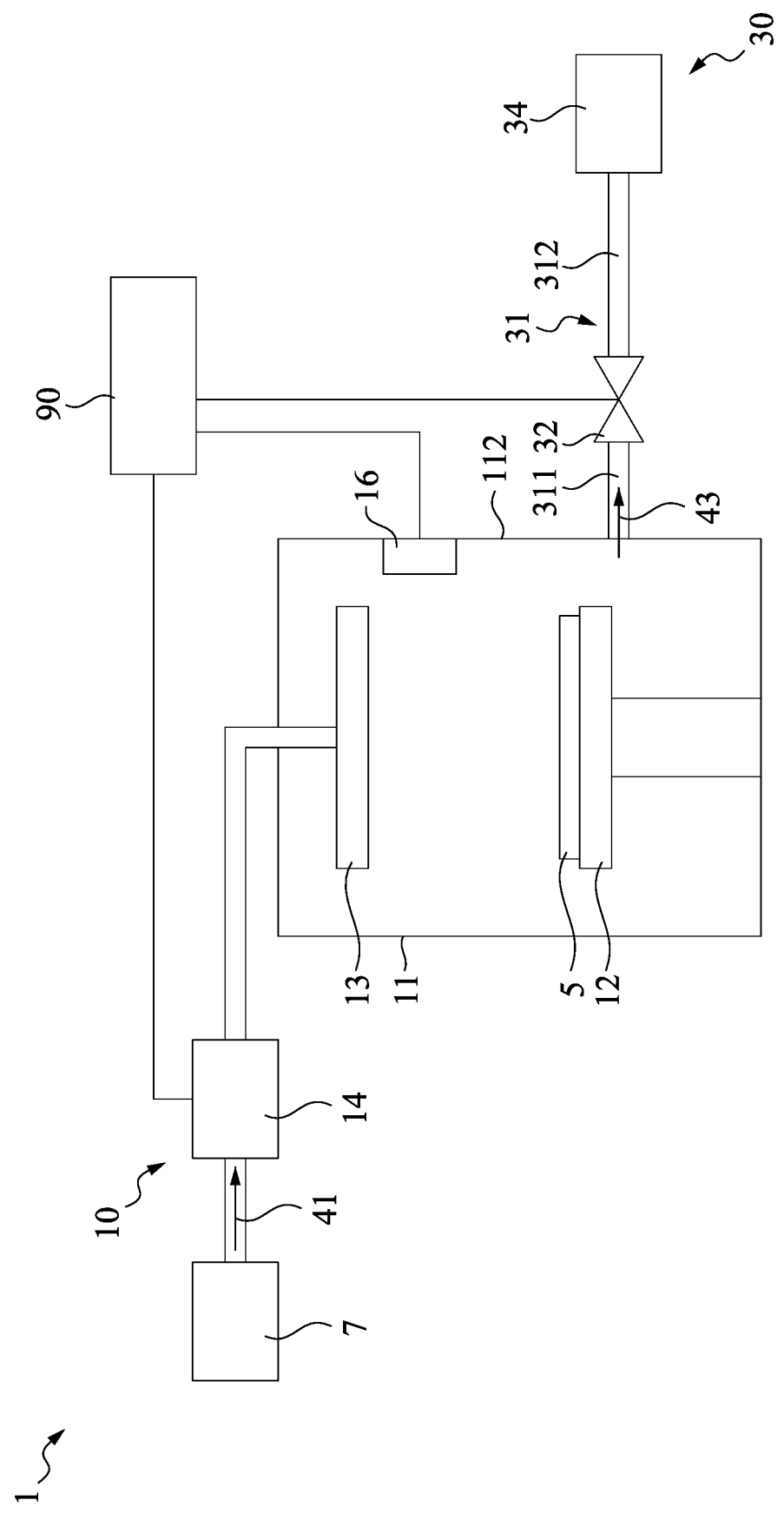
FIG. 2 shows a cross-sectional view of partial elements of a wafer fabricating system, in accordance with some embodiments.

FIG. 2 shows a cross-sectional view of partial elements of one of the processing tool 10, in accordance with some embodiments. The process performed in the processing tool 10 may include a chemical dry etching process. However, the wafer fabricating system 1 is not limited to perform above-mentioned processes and may be used wherever the semiconductor wafer 5 is processed in a chamber, in which gaseous material is removed through an exhausting module including a valve.

In some embodiments, the processing tool 10 includes a gas source 7, an etching chamber 11, a gas controller 14, a pressure sensor 16, and a gas exhausting module 30. The gas source 7 is configured to supply one or more processing gas 41 into the etching chamber 11. The gas source 7 may supply a processing gas 41 that passes over a surface of the semiconductor wafer 5 to bring about a selective removal of oxide and other contaminant layers. The processing gas 41 from the gas source 7 may be a fluorine-containing gas or other gas that will react with a material formed on the surface of the semiconductor wafer 5. In one embodiment, for example, the processing gas 41 comprising an etch chemistry having xenon difluoride ($XeF_2$) or hydrogen fluoride ($HF_6$), combinations of these, or the like, although any other suitable processing gas 41 may alternatively be utilized. The gas source 7 may be a vessel, such as a gas storage tank, that is located either locally to the etching chamber 11 or else may be located remotely from the etching chamber 11. Alternatively, the gas source 7 may be a facility that independently prepares and delivers the processing gas 41 to the gas controller 14. Any suitable source for the processing gas 41 may be utilized as the gas source 7, and all such sources are fully intended to be included within the scope of the embodiments:

The gas source 7 may supply the desired processing gas to the gas controller 14. The gas controller 14 may be utilized to control the flow of the processing gas to the etching chamber 11, thereby also helping to control the pressure within the etching chamber 11. The gas controller 14 may be, e.g., a proportional valve, a modulating valve, a needle valve, a pressure regulator, a mass flow controller, combinations of these, or the like. However, any suitable method for controlling and regulating the flow of the processing gas to the etching chamber 11 may be utilized, and all such components and methods are fully intended to be included within the scope of the embodiments.

It will be appreciated that while the processing tool 10 has been described herein as connecting with a single gas source 7, this is merely an illustrative example and is not intended to limit the embodiments in any fashion. Any type of suitable gas delivery module, with any type and number of gas source and gas controller identical to or different from any of the other gas delivery modules, such as the gas source 7 and gas controller 14 within the processing tool 10, may alternatively be utilized. All such modules are fully intended to be included within the scope of the embodiments.

In one embodiment, the gas controller 14 is controlled by instructions received from the control module 90 (see FIG. 1). The gas controller 14, upon receiving instructions from the control module 90, may open and close valves so as to connect the gas source 7 to the etching chamber 11 and direct a desired processing gas through a showerhead 13 into the etching chamber 11. The showerhead 13 may be utilized to disperse the chosen processing gas into the etching chamber 11 and may be designed to evenly disperse the processing gas in order to minimize undesired process conditions that may arise from uneven dispersal. In an embodiment the showerhead 13 may have a circular design with openings dispersed evenly around the showerhead 13 to allow for the dispersal of the desired processing gas into the etching chamber 11.

It will be appreciated that the introduction of processing gas to the etching chamber 11 through a single showerhead 13 or through a single point of introduction as described above is intended to be illustrative only and is not intended to be limiting to the embodiments. Any number of separate and independent showerheads 13 or other openings to introduce processing gas into the etching chamber 11 may alternatively be utilized. All such combinations of showerheads and other points of introduction are fully intended to be included within the scope of the embodiments.

The etching chamber 11 may receive the desired processing gas and expose the processing gas to the semiconductor wafer 5, and the etching chamber 11 may be any desired shape that may be suitable for dispersing the processing gas and contacting the processing gas with the semiconductor wafer 5. The etching chamber 11 may have a cylindrical sidewall and a bottom. However, the etching chamber 11 is not limited to a cylindrical shape, and any other suitable shape, such as a hollow square tube, an octagonal shape, or the like, may alternatively be utilized. The side walls 112 of the etching chamber 11 may be any suitable material that can withstand the chemistries and pressures involved in the chemical etching process, in an embodiment the side walls 112 may be steel, stainless steel, nickel, aluminum, alloys of these, combinations of these, and like.

Within the etching chamber 11, the semiconductor wafer 5 may be placed on a wafer chuck 12 in order to position and control the semiconductor wafer 5 during the chemical etching process. The wafer chuck 12 may include heating mechanisms (not shown in figures) in order to heat the semiconductor wafer 5 during the chemical etching process. Furthermore, while a single wafer chuck 12 is illustrated in FIG. 2, any number of wafer chucks 12 may additionally be included within the etching chamber 11 for chemical etching process.

The pressure sensor 16 is configured to detect or monitor a pressure in the etching chamber 11. In some embodiments, the pressure sensor 16 is placed on a sidewall 112 of the etching chamber 11. The pressure sensor 16 outputs a signal representing the rate of change in gas pressure in the etching chamber 11 to the control module 90. In such case, the pressure sensor 16 includes a special purpose processor or hardware for performing the calculation, and outputs a digital or analog signal proportional to the rate of change in gas pressure. However, it will be appreciated that many variations and modifications can be made to embodiments of the disclosure. In some other embodiments, the pressure sensor 16 outputs signal of gas pressure in the etching chamber 11, and the calculation for the rate of change in gas pressure is performed externally (e.g., by the control module 90).

The gas exhausting module 30 is configured to remove gaseous material and particles from the etching chamber 11. In some embodiments, the gas exhausting module 30 includes a gas pipe 31, a valve 32 and a pump 34. The gas pipe 31 is connected to a gas outlet port (not shown in figures) of the etching chamber 11. The pump 34 is fluidly connected to the gas pipe 31 for producing an exhaust flow 43 from the etching chamber 11. The valve 32 is connected to the gas pipe 31 and configured to regulate the exhaust flow 43 in the gas pipe 31. In some embodiments, the gas pipe 31 includes an upstream segment 311 and a downstream segment 312. The upstream segment 311 is connected between the sidewall 112 of the etching chamber 11 and the valve 32. The downstream segment 312 is connected between the valve 32 and the pump 34.

Figure 3A:
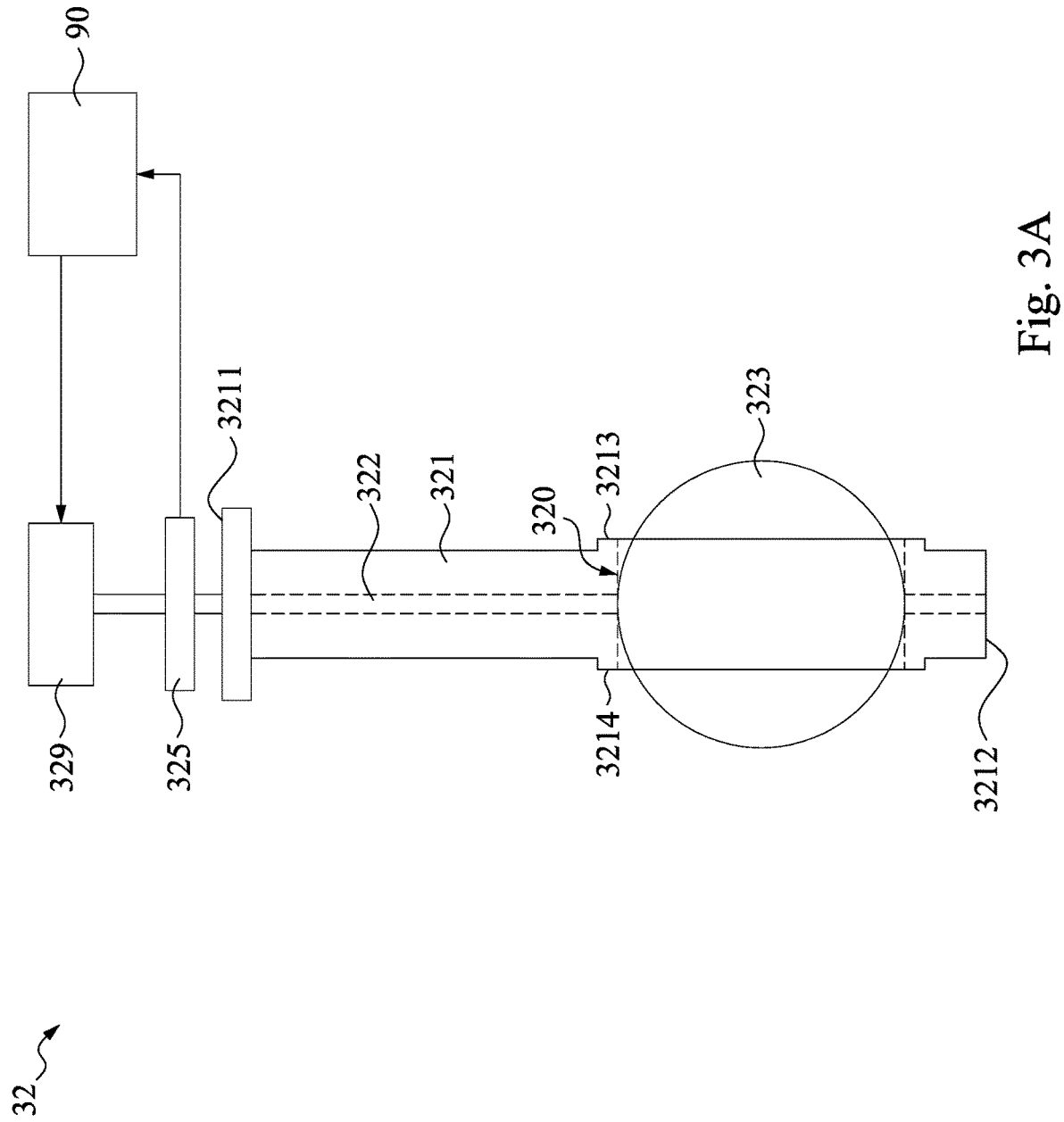
FIG. 3A shows a schematic view of a valve connecting with a control module, in accordance with some embodiments.

FIG. 3A shows a schematic view of the valve 32 connecting with the control module 90, in accordance with some embodiments. In some embodiments, the valve 32 is a butterfly valve and includes a housing 321, a shaft 322, a disc 323, a measuring device 325 and a driving device 329. The housing 321 is formed in a cylinder shape and extends from a top end 3211 to a bottom end 3212. A channel 320 for allowing a delivery of a gas flow is formed on the housing 321. In some embodiments, the channel 320 is formed on a lower section of the housing 321 which is closer to the bottom end 3212 and penetrates two opposite surfaces 3213 and 3214 of the housing 321. The shaft 322 extends along the longitudinal direction of the housing 321 with one end connected to the bottom end 3212 and the other end exposed to the top end 3211 of the housing 321. The disc 323 is located in the channel 320 and connected to the shaft 322. As such, the rotation angle of the disc 323 relative to the channel 320 is controlled by the shaft 322.

The measuring device 325 is configured to measure a condition of the shaft 322 (or otherwise the disc 323). In some embodiments, the measuring device 325 is a torque sensor or torque transducer and configured for measuring and recording the torque on the shaft 322. Many mechanisms can be used to achieve the measurement of the torque. In one embodiment, for example, the measuring device 325 includes a series of permanent magnets (not shown in figures) attached to the shaft 322 and a non-contact sensor (not shown in figures) configured to measure magnetic characteristics of the magnetic domains so as to produce data in relation to the torque of the shaft 322. However, it will be appreciated that many variations and modifications can be made to embodiments of the disclosure. Any measurement mechanism which can measure a movement of the shaft 322 including rotation angle and linear movement may alternatively be utilized. A detection result representing the condition of the shaft 322 produced from the measuring device 325 is transmitted to the control module 90 for analyzing.

The driving device 329 is configured to control the rotation of the shaft 322 so as to regulate the open ratio of the valve 32. In some embodiments, the driving device 329 controls the rotation of the shaft 322 according to a control signal issued from the control module 90 according to data in relation to the gas pressure in the etching chamber 11 (see FIG. 2).

Figure 3C:
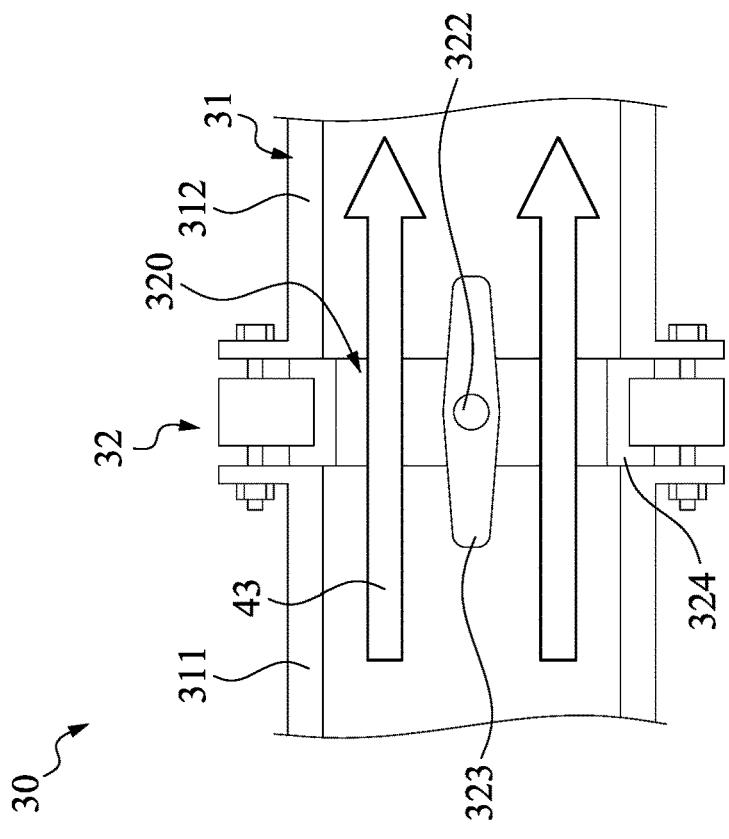
FIG. 3C shows a cross-sectional view of a valve connecting with gas pipes in which an exhaust flow passes through a channel of the valve as an open ratio of the valve is greater than 0, in accordance with some embodiments.
Figure 3B:
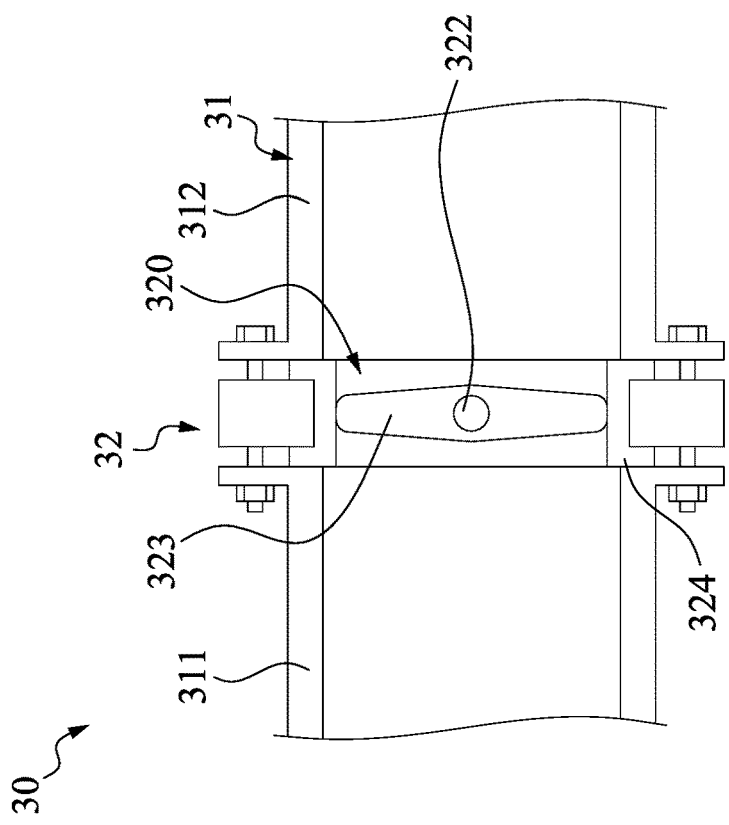
FIG. 3B shows a cross-sectional view of a valve connecting with gas pipes in which an exhaust flow is blocked by a disc of the valve as an open ratio of the valve is 0, in accordance with some embodiments.

In one exemplary embodiment, as shown in FIG. 3B, when the valve 32 is closed state (i.e., open ratio is 0), the disc 323 is perpendicular to an extension direction of the gas pipe 31, and the edge of the disc 323 engage with a sealing ring 324 surrounding the channels 320. No exhaust flow is allowed to passes through the valve 32. In order to change the open ratio of the valve 32, the control module 90 issues a control signal to the driving device 329 to rotate the shaft 322 so as to change a rotation angle of the disc 323 relative to the channel 320. For example, as shown in FIG. 3C, the valve 32 is driven to a full open state (i.e., open ratio is 1), at which the disc 323 is parallel to an extension direction of the gas pipe 31. As a result, the exhaust flow 43 from the upstream segment 311 is allowed to passes through the channel 320 and flow into the downstream segment 312 of the gas pipe 31. In some embodiments, the driving device 329 includes an electric motor, such as brushless DC motor. The driving device 329 can set the disc 323 at any rotation angle from 0 degree (as shown in FIG. 3B) to 90 degrees (as shown in FIG. 3C) by rotating the shaft 322. A larger rotation angle (or otherwise larger open ratio) means a greater amount of flow rate of the exhaust flow, and vice versa.

However, as one of ordinary skill in the art will recognize, while the valve 32 is used to regulate the exhaust flow 43 from the etching chamber 11, this is merely an illustrative example and is not intended to limit the embodiments in any fashion. Any type of suitable flow controlling member may alternatively be utilized. All such modules are fully intended to be included within the scope of the embodiments of the present disclosure.

FIG. 4A shows a cross-sectional view of a valve 32a, in accordance with another embodiment of the present disclosure. In the embodiment shown in FIG. 4A, the valve 32a is a gate type valve and includes a housing 321a, a shaft 322a, a disc 323a, a measuring device 325a and a driving device 329a. A channel 320a for allowing delivery of a gas flow is formed on the housing 321a. In some embodiments, the channel 320a has an upper inner wall 326a and a lower inner sidewall 328a opposite to the upper inner wall 326a. An opening 327a is formed at a center of the upper inner wall 326a. The shaft 322a extends along the longitudinal direction of the housing 321a with one end exposed to the top of the housing 321a. The disc 323a is movable located in the opening 327a formed on the upper inner wall 326a and connected to a lower end of the shaft 322a through threads. As such, a height of the disc 323a relative to the lower inner sidewall 328a is controlled by the shaft 322a. In some embodiments, the measuring device 325a and the driving device 329a have substantially the same configuration as the measuring device 325 and the driving device 329 in FIG. 3A, and thus are not repeated for the sake of brevity.

In one exemplary embodiment, as shown in FIG. 4A, when the valve 32a is closed state (i.e., open ratio is 0%), the disc 323a abuts against the lower inner sidewall 328a. No exhaust flow is allowed to passes through the valve 32a. In order to change the open ratio of the valve 32a, the control module 90 (see FIG. 2) issues a control signal to the driving device 329a to rotate the shaft 322a so as to change a height of the disc 323a relative to the lower inner sidewall 328a of the channel 320a. For example, as shown in FIG. 4B, the valve 32a is driven to a half-open state (i.e., open ratio is 50%), at which a lower end of the disc 323a is distant away from the lower inner sidewall 328a of the channel 320a by a half of a distance between the upper inner wall 326a and the lower inner sidewall 328a. As a result, the exhaust flow 43 is allowed to passes through the channel 320a. The driving device 329a can set the disc 323a at any height by rotating the shaft 322a, for example. A greater height of the disc 323a (or otherwise larger open ratio) means a greater amount of flow rate of the exhaust flow 43, and vice versa.

FIG. 5A shows a cross-sectional view of a valve 32b, in accordance with another embodiment of the present disclosure. In the embodiment shown in FIG. 5A, the valve 32b is a flexible body type valve and includes a housing 321b, a shaft 322b, a disc (or diaphragm) 323b, a measuring device 325b and a driving device 329b. A channel 320b for allowing delivery of a gas flow is formed on the housing 321b. In some embodiments, the channel 320b has an upper inner wall 326b and a lower inner sidewall 328b opposite to the upper inner wall 326b. An opening 327b is formed at a center of the upper inner wall 326b, and the lower inner sidewall 328b has a protrusion 3280b faces the opening 327b. The shaft 322b has one end exposed to the top of the housing 321b and connected to the housing 321b through threads. The disc 323b covers the opening 327b and connected to a lower end of the shaft 322b. As such, a height of the disc 323b relative to the protrusion 3280b of the lower inner sidewall 328b is controlled by the shaft 322b. In some embodiments, the measuring device 325b and the driving device 329b have substantially the same configuration as the measuring device 325 and the driving device 329 in FIG. 3A, and thus are not repeated for the sake of brevity.

In one exemplary embodiment, as shown in FIG. 5A, when the valve 32b is closed state (i.e., open ratio is 0%), the disc 323b abuts against the protrusion 3280b. No exhaust flow is allowed to passes through the valve 32b. In order to change the open ratio of the valve 32b, the control module 90 (see FIG. 2) issues a control signal to the driving device 329b to rotate the shaft 322b so as to change a height of the disc 323b relative to the lower inner sidewall 328b of the channel 320b. For example, as shown in FIG. 5B, the valve 32b is driven to a full-open state (i.e., open ratio is 100%), at which a lower end of the disc 323b is distant away from the lower inner sidewall 328b of the channel 320b by a distance between the upper inner wall 326b and the lower inner sidewall 328b. As a result, the exhaust flow 43 is allowed to passes through the channel 320b. The driving device 329b can set the disc 323b at any height by rotating the shaft 322b. A greater height of the disc 323b (or otherwise larger open ratio) means a greater amount of flow rate of the exhaust flow 43, and vice versa.

Figure 6:
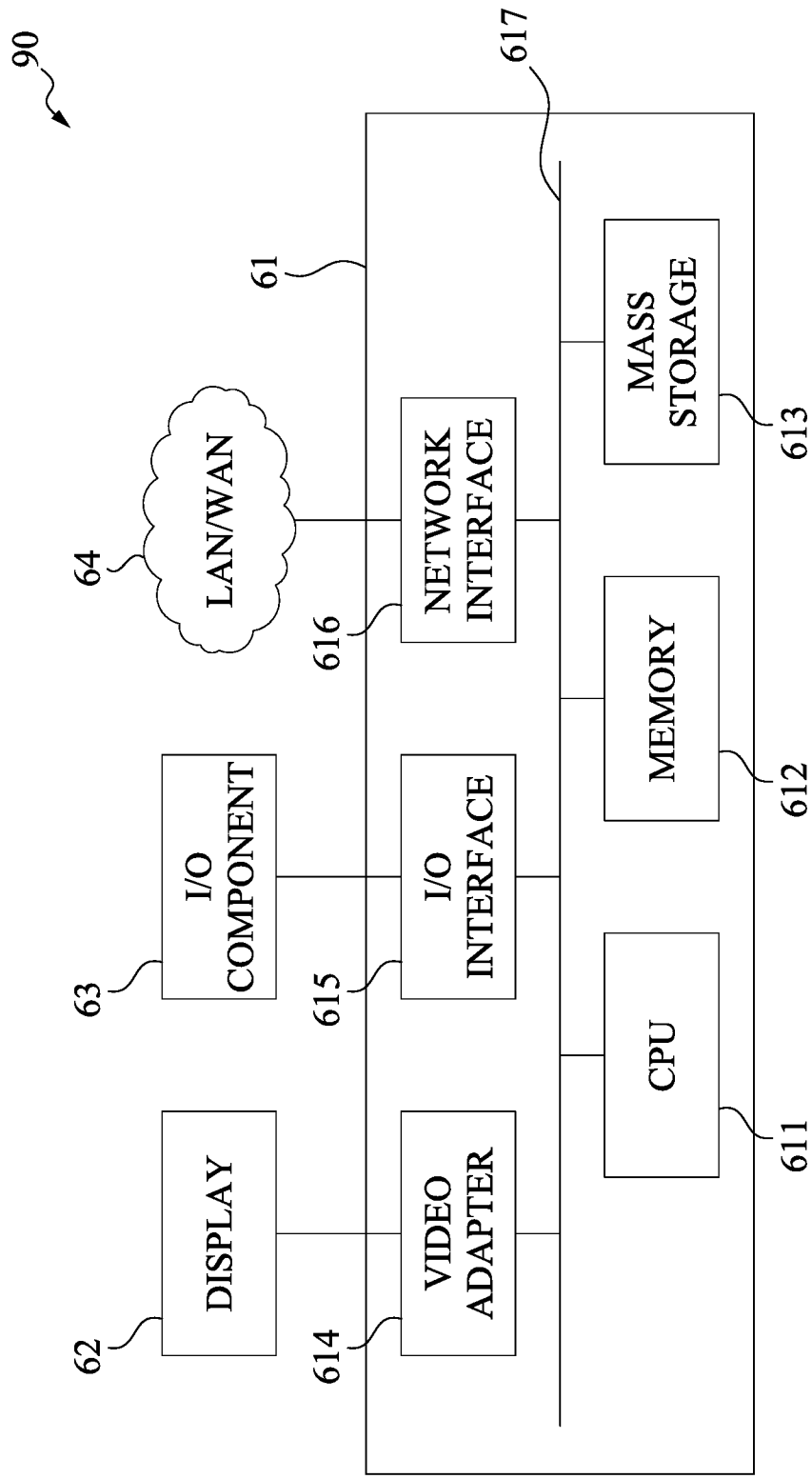
FIG. 6 shows a block diagram of a control module, in accordance with some embodiments.

FIG. 6 shows a block diagram of the control module 90, in accordance with some embodiments. The control module 90 may be any form of computer processor that can be used in an industrial setting for controlling process machines or may alternatively be a general purpose computer platform programmed for such control. In an embodiment the control module 90 may include a processing unit 61, such as a desktop computer, a workstation, a laptop computer, or a dedicated unit customized for a particular application. The control module 90 may be equipped with a display 62 and one or more input/output components 63, such as instruction outputs, sensor inputs, a mouse, a keyboard, printer, combinations of these, or the like. The processing unit 61 may include a central processing unit (CPU) 611, memory 612, a mass storage 613, a video adapter 614, and an I/O interface 615 connected to a bus 617.

The bus 617 may be one or more of any type of several bus architectures including a memory bus or memory controller, a peripheral bus, or video bus. The CPU 611 may include any type of electronic data processor, and the memory 612 may include any type of system memory, such as static random access memory (SRAM), dynamic random access memory (DRAM), or read-only memory (ROM). In some embodiments, the CPU 611 include an application-specific integrated circuit (ASIC) hardwired to perform one or more of the processes described herein. The mass storage 613 may include any type of storage device configured to store data, programs, and other information and to make the data, programs, and other information accessible via the bus 617. The mass storage 613 may include, for example, one or more of a hard disk drive, a magnetic disk drive, or an optical disk drive.

The video adapter 614 and the I/O interface 615 provide interfaces to couple external input and output devices to the processing unit 61. As illustrated in FIG. 6, examples of input and output devices include the display 62 coupled to the video adapter 614 and the I/O component 63, such as a mouse, keyboard, printer, and the like, coupled to the I/O interface 615. It will be appreciated that other devices may be coupled to the processing unit 61 and additional or fewer interface cards may be utilized. For example, a serial interface card (not shown) may be used to provide a serial interface for a printer. The processing unit 61 also may include a network interface 616 that may be a wired link to a local area network (LAN) or a wide area network (WAN) 64 and/or a wireless link.

It will be noted that the control module 90 may include other components. For example, the control module 90 may include power supplies, cables, a motherboard, removable storage media, cases, and the like. These other components, although not shown in FIG. 6, are considered part of the control module 90.

Figure 7:
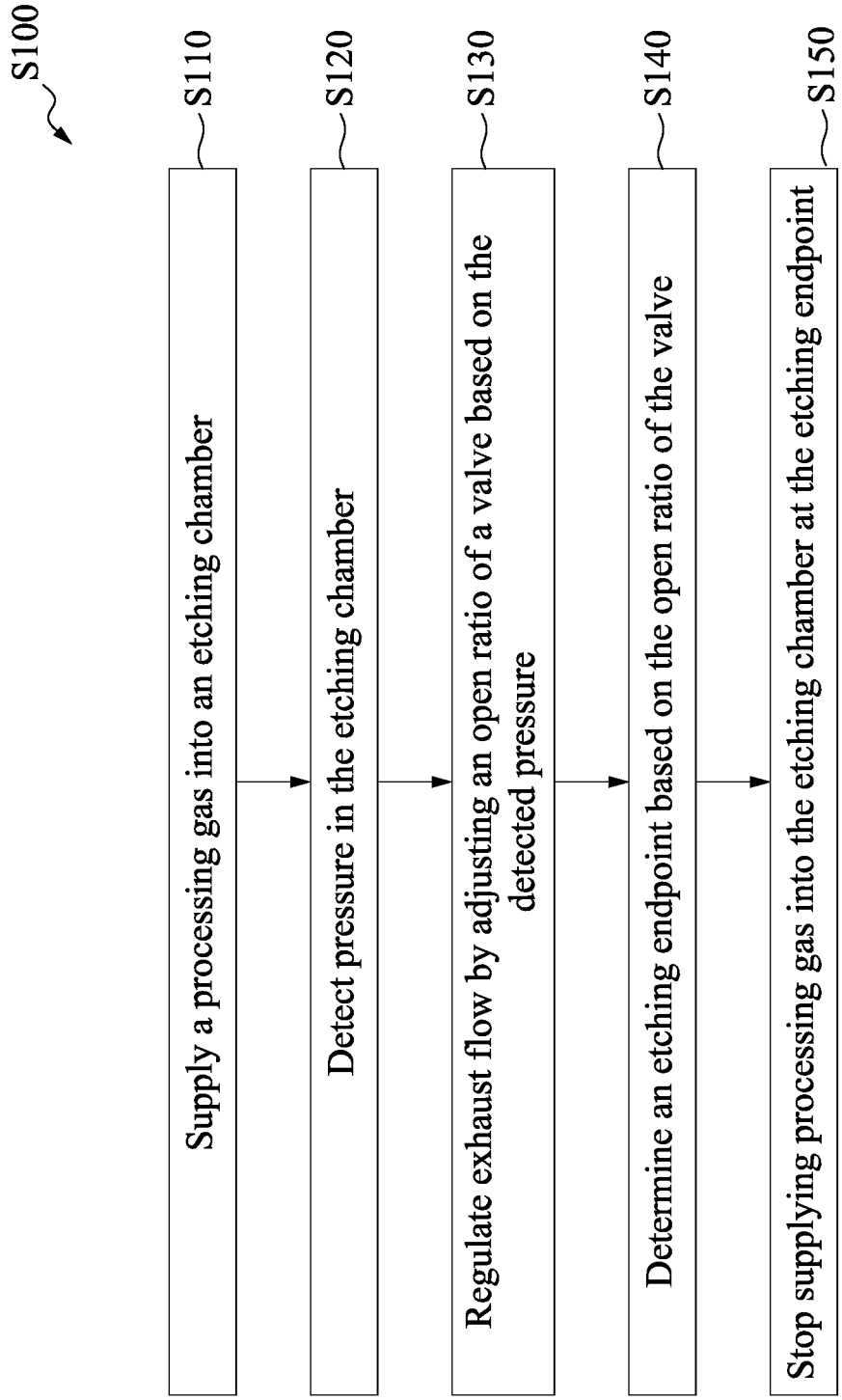
FIG. 7 shows a flow chart illustrating a method for processing a semiconductor wafer in a wafer fabricating system, in accordance with some embodiments.
Figure 8:
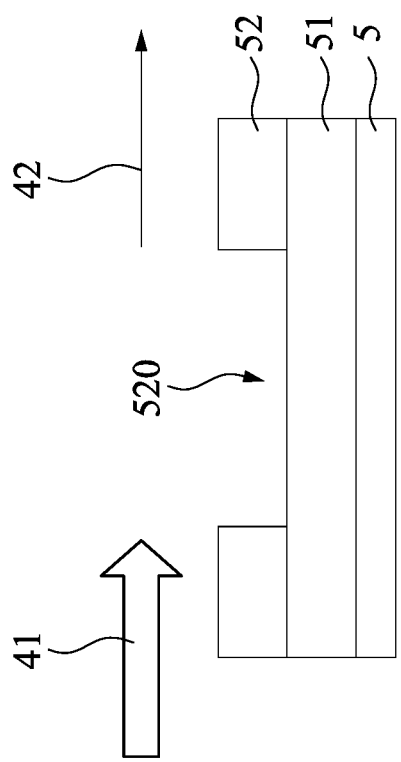
FIG. 8 shows a schematic view of a stage of a method of recessing a material layer on a semiconductor wafer in which a processing gas is supplied over the semiconductor wafer and a by-product gas is formed after a reaction of the processing gas, in accordance with some embodiments.

FIG. 7 is a flow chart illustrating a method S100 for processing semiconductor wafers 5, in accordance with some embodiments. For illustration, the flow chart will be described along with the drawings shown in FIGS. 1-6 and 8-10. Although the method S100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations:

The method S100 begins with operation S110, in which a processing gas 41 is supplied into an etching chamber 11 for a chemical dry etching process. In some embodiments, prior to operation S110, the semiconductor wafer 5 is moved into the etching chamber 11 by a robot 6 (see FIG. 1) and placed on the wafer chuck 12, as show in FIG. 2. In some embodiments, as shown in FIG. 8, a thin film of material 51 is formed on the semiconductor wafer 5. The thin film of material 51 on the semiconductor wafer 5 includes, but not limited to, metals, silicon dioxide, tungsten, silicon nitride, silicon oxynitride, and various dielectrics. In one exemplary embodiment, the thin film of material 51 on the semiconductor wafer 5 includes Molybdenum (Mo). In some embodiments, a hard mask 52 is formed on the thin film of material 51. The hard mask 52 may include silicon oxide film, and the silicon nitride film in the hard mask 52 may be patterned by etching. The hard mask 52 is patterned by lithography and etching process, and the thin film of material 51 uses the patterned hard mask 52 as an etch mask.

In some embodiments, to supply the processing gas 41 into the etching chamber 11, the gas controller 14, upon receiving instructions from the control module 90, is opened so as to connect the gas source 7 to the etching chamber 11 and direct a desired processing gas through a showerhead 13 into the etching chamber 11. The processing gas 41, as shown in FIG. 8, is reacted with the thin film of material 51 on the semiconductor wafer 5, and a byproduct gaseous material 42 is produced. In one exemplary embodiment, a chemical equation for etching a Mo layer by xenon difluoride ($XeF_2$) is as follows:

$$Mo(s) + 3XeF_2(g) \rightarrow 1MoF_6(g) + 3Xe(g) \qquad (I)$$

The method S100 also includes operation S120, in which a pressure in the etching chamber 11 is detected. In some embodiments, the pressure sensor 16 in the etching chamber 11 is utilized to detect a gas pressure in the etching chamber 11. The pressure sensor 16 may produce a digital or analog signal in relation to the gas pressure in the etching chamber 11 to the control module 90. Alternatively, the pressure sensor 16 may produce a digital or analog signal proportional to the rate of change in gas pressure to the control module 90.

In some embodiments, operation S120 is initiated after operation S110 is performed for a predetermined time period. For example, in a graph shown in FIG. 10, operation S120 may be initiated at time T1. The time T1 may be determined according to experiences data which tells a gas pressure in the etching chamber 11 may become unstable. Alternatively, the time T1 may be determined based on an estimated time T3 at which the etching process is estimated to be finished. The time T1 may be in a range of 80% to about 90% of the time T3. By detecting the gas pressure in the etching chamber 11 at the end of the etching process, the amount of data produced by the pressure sensor 16 is reduced, and therefore the control module 90 can analyze the abstract data with limited sources.

The method S100 also includes operation S130, in which an exhaust flow 43 is regulated by adjusting an open ratio of a valve. In some embodiments, the exhaust flow 43 is created by the gas exhausting module 30 from the etching chamber 11. The exhaust flow 43 may include the unreacted processing gas, byproduct gaseous material, and/or particles. In some embodiments, the etching process is performed in a vacuum environment. To remove gases in the etching chamber, the exhaust flow 43 is created is initiated before operation S110 and after the loading of the semiconductor wafer 5 into the etching chamber 11.

In some embodiments, the pressure in the etching chamber 11 during an etching process is desired to be controlled in an acceptable range to control the uniformity of etching. In the present embodiment, the open ratio of the valve 32 is a tunable parameter to control the gas pressure in the etching chamber 11, and the open ratio of the valve 32 can be controlled according to the detected gas pressure in the etching chamber 11. For example, when a detected pressure exceeds the acceptable range, the control module 90 may issue a signal to increase the open ratio of the valve 32 so as to produce an exhaust flow 43 having higher flow rate and ultimately decrease the gas pressure in the etching chamber 11. Similarly, when a detected pressure is lower than the acceptable range, the control module 90 may issue a signal to decrease the open ratio of the valve 32 so as to produce an exhaust flow 43 having slower flow rate and ultimately increase the gas pressure in the etching chamber 11.

In some embodiments, when a constant volume (V) and a constant temperate (T) are controlled in the etching chamber 11, the gas pressure (P) in the etching chamber 11 is directly proportional to the numbers of moles of gaseous component in the etching chamber 11. For example, in the above etching process equation (1), a stoichiometric number of the processing gas is 3, and a sum of stoichiometric numbers of gaseous product components is 4 (i.e., 1+3). Since the stoichiometric number of the processing gas is less than the sum of stoichiometric numbers of gaseous product components, a gas pressure in the etching chamber 11 during a stable etching process is greater than a gas pressure in the etching chamber 11 in the end of the etching process or when the etching process is finished.

However, as above-mentioned, in order to improve etching uniformity, the gas pressure (P) in the etching chamber 11 is stably controlled at a constant. Therefore, the open ratio of the valve 32 is controlled in relation to the change in the numbers of moles of gaseous component in the etching chamber 11. As a result, an etching endpoint can be determined by a measurement of an open ratio of the valve 32 in cases where a stoichiometric number of the processing gas for an etching process is different from a sum of stoichiometric numbers of gaseous product components.

Figure 10:
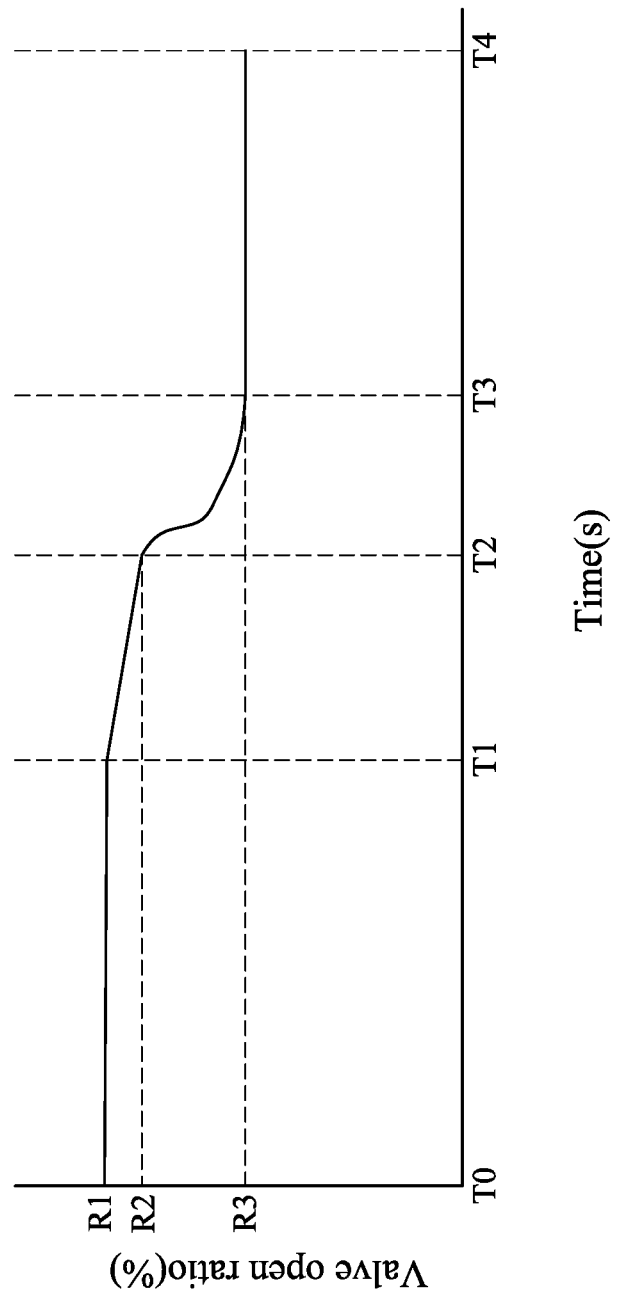
FIG. 10 shows a diagram of a valve open ratio versus a processing time of a wafer process, in accordance with some embodiments.

One example to determine an etching endpoint based open ratio of the valve 32 is illustrated accompanying with the graph of FIG. 10 which demonstrates a change of open ratio of the valve 32 versus processing time during an etching process conducted according to above chemical equation (1) in an experimental data. The etching process shown in FIG. 10 initiates at time T0. At the beginning of the etching process (from time T0 to time T1), as shown in FIG. 8, the processing gas 41 stably reacts with the material 51 and produce a byproduct gaseous material 42. Therefore, the gas pressure in the etching chamber 11 maintains at substantially the same level, and the valve 32 is kept having an open ratio R1.

In a subsequent time period, for example, the time period between T1 and T2, a partial element underlying the thin film of material 51 is exposed to the processing gas 41, which causes a change in a gas pressure in the etching chamber 11. In the present embodiment, in order to keep the gas pressure in the etching chamber 11 within the acceptable range, the open ratio R1 of the valve 32 is gradually adjusted to open ratio R2 during the time period between time T1 and time T2 based on the change in gas pressure in the etching chamber 11.

In a subsequent time period, for example, the time period between T2 and T3 since the thin film of material 51 exposed by the recess 520 is almost all reacted with the processing gas 41, the amount of the byproduct gaseous material 42 is decreased dramatically, which causes a sharp drop of gas pressure in the etching chamber 11. In the present embodiment, in order to keep the gas pressure in the etching chamber 11 within the acceptable range, the open ratio R2 of the valve 32 is adjusted to open ratio R3 during the time period between T2 and T3 based on the change in gas pressure in the etching chamber 11.

Figure 9:
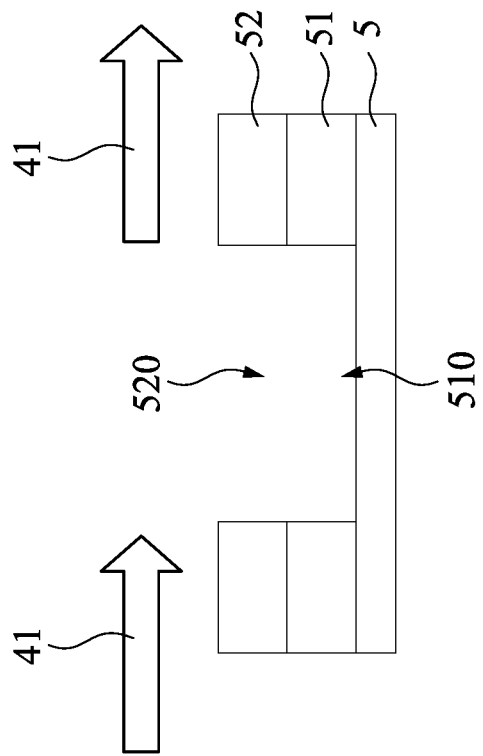
FIG. 9 shows a schematic view of a stage of a method of recessing a material layer on a semiconductor wafer in which a processing gas is supplied over the semiconductor wafer and passes through the semiconductor wafer, in accordance with some embodiments.

In some embodiments, after time T3, since the thin film of material 51 exposed by the recess 520 is consumed and the opening 510 is formed, the etching chamber 11 is filled with the processing gas 41, and no more or very few amounts of byproduct gaseous material 42 is left in the etching chamber 11, as shown in FIG. 9. Therefore, the gas pressure in the etching chamber 11 maintains at substantially the same level, and the valve 32 is kept having an open ratio R3.

The method S100 continues with operation S140, in which an etching endpoint is determined based on the open ratio of the valve 32. In some embodiments, the etching process is ended at the etching endpoint, and the etching endpoint is determined by an open ratio of the valve 32. For the valve 32 shown in FIG. 3A, the open ratio of the valve 32 is proportional to a rotation angle of the disc 323, and the rotation angle of the disc 323 can be calculated by measuring a rotation angle of the shaft 322 with the use of the measuring device 325.

In accordance with some embodiments, methods of measuring the open ratio of the valves in different embodiments are described below. In some embodiments, for the valve 32a shown in FIGS. 4A and 4B, the open ratio of the valve 32a is proportional to a height of the disc 323a relative to the lower inner sidewall 328a, and the height of the disc 323a can be calculated by measuring a rotation angle of the shaft 322a with the use of the measuring device 325a. In some embodiments, for the valve 32b shown in FIGS. 5A and 5B, the open ratio of the valve 32b is proportional to a height of the disc 323b relative to the protrusion 3280b of the lower inner sidewall 328b, and the height of the disc 323b can be calculated by measuring a rotation angle of the shaft 322b with the use of the measuring device 325b.

In the cases where etching process of equation (1) is performed in the processing tool 10 shown in FIG. 2, a measurement of the open ratio of the valve 32 equal to the open ratio R3 (see FIG. 10) indicates an etching endpoint occurs. The open ratio R3 may be derived from experience and empirical data correlated with the thickness and property of the thin film of material 51 being processed.

Other examples feasible to operation S140 are as follows:

$$Si_{(s)} + 2XeF_{2(g)} \rightarrow SiF_{4(g)} + 2Xe_{(g)} \qquad (2)$$

$$SiO_{2(s)} + 4HF_{(g)} \rightarrow SiF_{4(g)} + 2H_2O_{(g)} \qquad (3)$$

Similar to equation (1), in the etching process of equation (2), a stoichiometric number of the processing gas (i.e., xenon difluoride) is 2, and a sum of stoichiometric numbers of gaseous product components is 3 (i.e., 1+2). Since the stoichiometric number of the processing gas is less than the sum of stoichiometric numbers of gaseous product components, a gas pressure in the etching chamber 11 during a stable etching process is greater than a gas pressure in the etching chamber 11 in the end of the etching process or when the etching process is finished. Therefore, the open ratio of the valve 32 will gradually decrease before the etching endpoint. The etching process of equation (2) will not stop until the open ratio of the valve 32 declines to a predetermined value.

On the contrary, the above etching process equation (3), a stoichiometric number of the processing gas (i.e., hydrogen fluoride) is 4, and a sum of stoichiometric numbers of gaseous product components is 3 (i.e., 1+2). Since the stoichiometric number of the processing gas is greater than the sum of stoichiometric numbers of gaseous product components, a gas pressure in the etching chamber 11 during a stable etching process is less than a gas pressure in the etching chamber 11 in the end of the etching process or when the etching process is finished. Therefore, the open ratio of the valve 32 will gradually increase before the etching endpoint. The etching process of equation (2) will not stop until the open ratio of the valve 32 grows to a predetermined value.

The method S100 continues with operation S150, in which the supply of the processing gas 41 into the etching chamber 11 is stopped at the etching endpoint. In some embodiments, once the control module 90 detects that the measurement of the open ratio of the valve 32 is equal to a predetermined value, such as open ratio R3 shown in FIG. 10, the control module 90 outputs a control signal to the gas controller 14 to stop the supply of the processing gas 41 into the etching chamber 11. In some embodiments, after the supply of the processing gas 41 is stopped, a nitrogen gas may be purged into the etching chamber 11 and removed by the gas exhausting module 30 to remove the hazardous gas in the etching chamber 11. The semiconductor wafer 5 is then removed from the processing tool 10.

The semiconductor wafer 5 removed from the processing tool 10 may undergo additional processes including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the substrate, and a pattern is formed in one or more of the layers.

Figure 11:
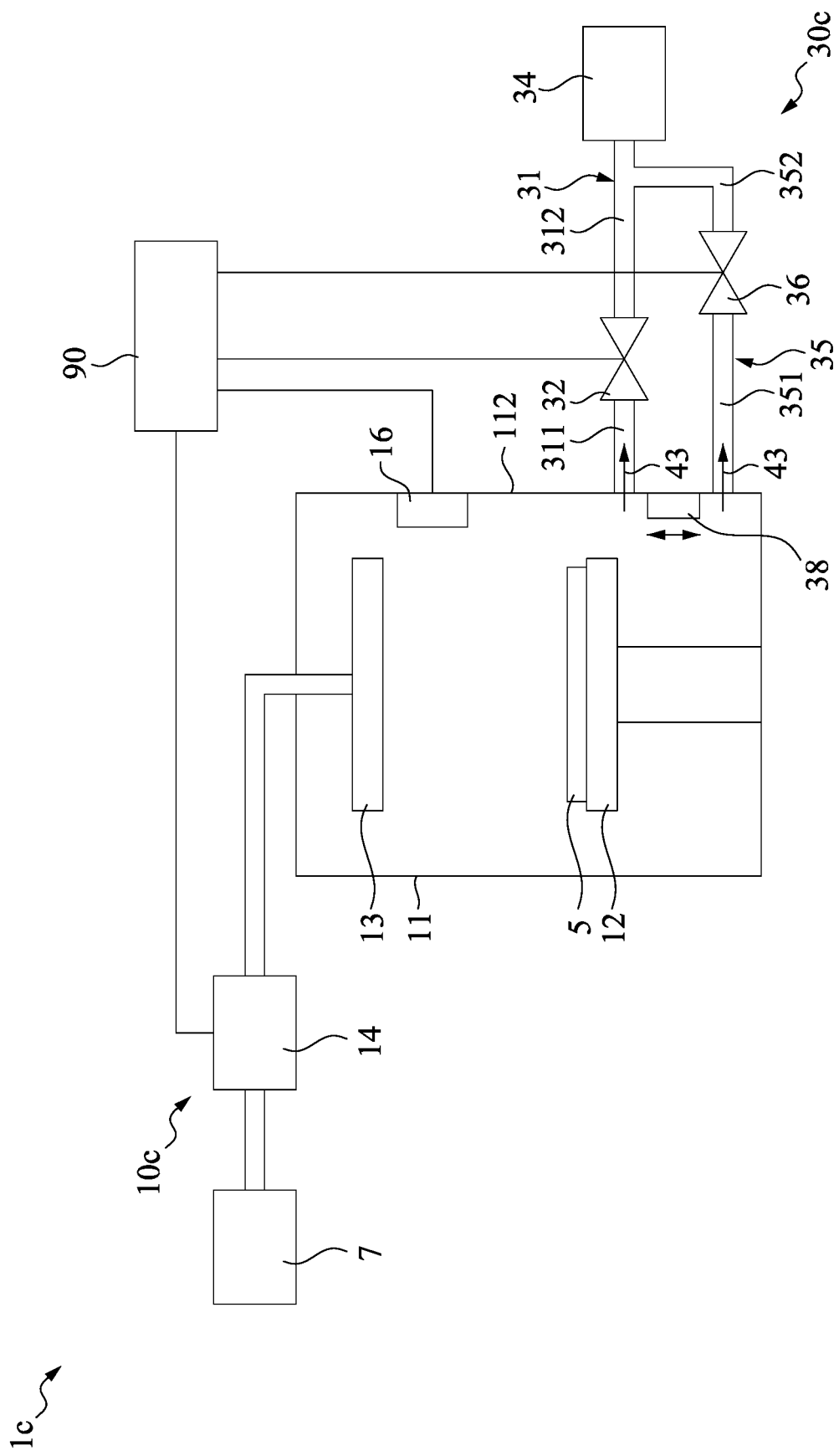
FIG. 11 shows a cross-sectional view of partial elements of a wafer fabricating system, in accordance with some embodiments.

FIG. 11 shows cross-sectional view of partial elements of a wafer fabricating system 1c, in accordance with some embodiments. The processing tool 10c is similar to the processing tool 10 shown in FIG. 2 and like components have like reference numbers. Differences between the processing tool 10c and the processing tool 10 includes the processing tool 10c replacing the gas exhausting module 30 with gas exhausting module 30c. In some embodiments, in addition to the gas pipe 31, the valve 32 and the pump 34, the gas exhausting module 30c further includes a gas pipe 35 and a valve 36. In the following descriptions, the valve 32 is referred to as "first valve", the valve 36 is referred to as "second valve", the gas pipe 31 is referred to as "first gas pipe", and the gas pipe 35 is referred to as "second gas pipe", for the purpose of clarity.

In some embodiments, the second gas pipe 35 includes an upstream segment 351 and a downstream segment 352. The upstream segment 351 is connected between the sidewall 112 of the etching chamber 11 and the second valve 36. The downstream segment 352 is connected between the second valve 36 and the downstream segment 312. In some embodiments, the gas exhausting module 30c further includes a door 38 for controlling the connection between the second gas pipe 35 and the etching chamber 11. The door 38 may be disposed on the sidewall 112 and cover an end of the upstream segment 351 that connects to the side wall 112. A driving mechanism (such as motor, not shown in figures) can be utilized to drive a movement of the door 38 to open the end of the upstream segment 351 and allow gaseous material in the etching chamber 11 to enter the second gas pipe 35. With such arrangement, exhaust flow 43 from the etching chamber 11 can be evacuated by the pump 34 through either the first gas pipe 31 or the second gas pipe 35.

It will be appreciated that while the second gas pipe 35 has been described herein as connecting with the downstream segment 312 of the gas pipe 31, this is merely an illustrative example and is not intended to limit the embodiments in any fashion. The second gas pipe 35 can be connected to any position which has a vacuum pressure less than the gas pressure in the etching chamber 11 during the etching process. For example, the second gas pipe 35 may be independent from the first gas pipe 31 and fluidly connected to a gas handling system of a fabrication plant (not shown in figures) located remotely from the processing tool 10c. Alternatively, another pump (not shown in figures) is connected to the second gas pipe 35 to create a vacuum in the second gas pipe 35.

Figure 12:
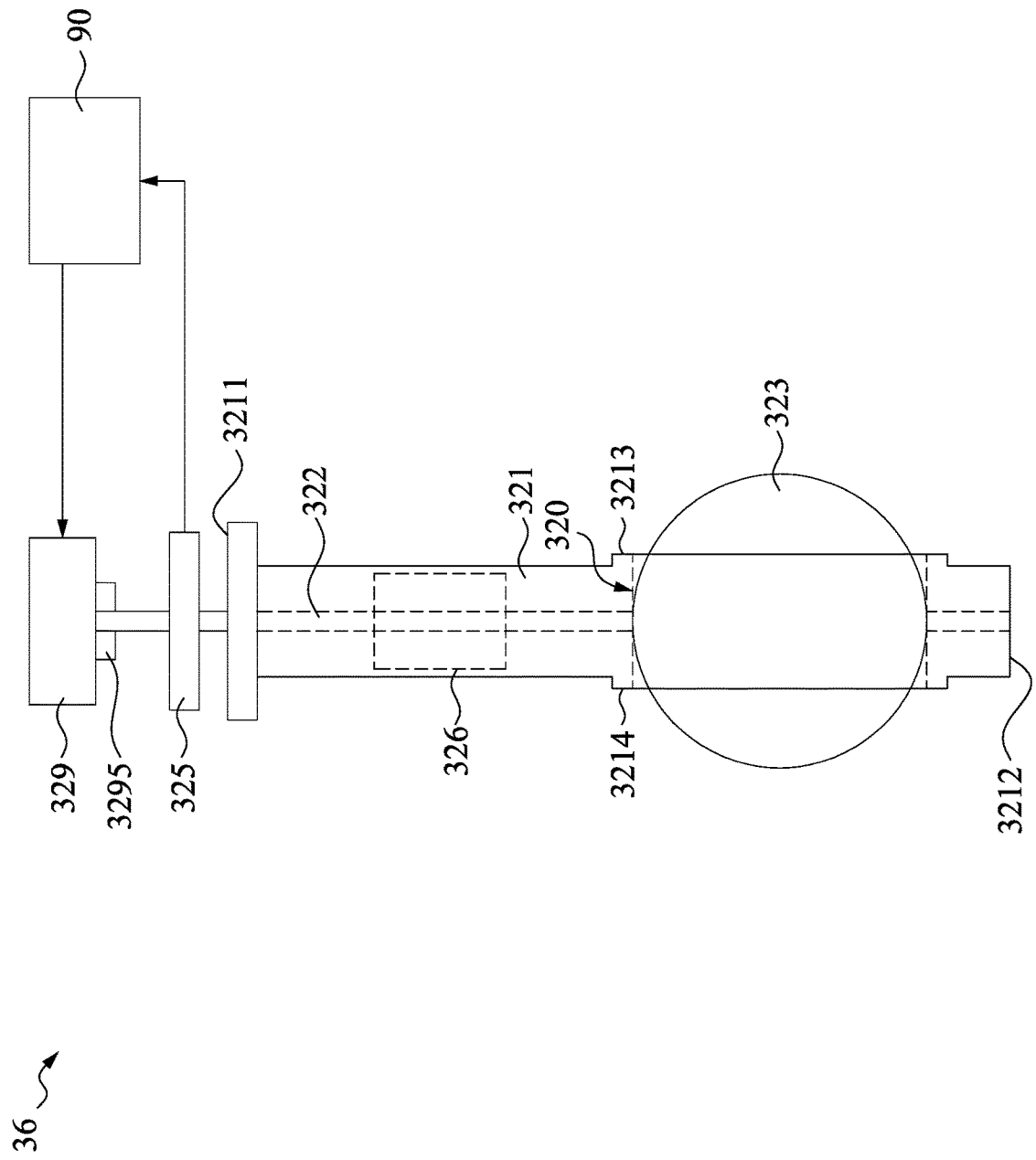
FIG. 12 shows a schematic view of a valve connecting with a control module, in accordance with some embodiments.

FIG. 12 shows a schematic view of the valve 36 connecting with the control module 90, in accordance with some embodiments. The valve 36 is similar to the valve 32 shown in FIG. 3 and like components have like reference numbers. Differences between the valve 36 and the valve 32 include the valve 36 further including a flexible member 326 and the driving device 329 further including a fastening member 3295.

In some embodiments, the flexible member 326 is located in the housing 321 and connected to the shaft 322. The flexible member 326 provides a resilience force on the shaft 322 to limit the rotation angle of the shaft 322 within a specific rage, such as 0 degree to 90 degrees. The shaft 322 is selectively connected to the driving device 329 through the fastening member 3295. When the fastening member 3295 engages with the shaft 322, the rotation of the shaft 322 can be controlled by the driving device 329. On the contrary, when the fastening member 3295 disengages from the shaft 322, the shaft 322 can be rotated by an external force, such as force applied on the disc 323 by the exhaust flow 43 passing through the channel 320. Due to the resilience force normally applied on the shaft 322 by the flexible member 326, the rotation angle of the shaft 322 (or otherwise disc 323) is proportional to a flow rate of the exhaust flow 43 passing through the channel 320.

It will be appreciated that while the valve 36 has been described herein being connected with the gas pipe 35, this is merely an illustrative example and is not intended to limit the embodiments in any fashion. The gas pipe 35 can be connected a valve having different configurations. For example, the gas pipe 35 may be connected to a gate type valve similar to the valve 32b described in FIG. 4A. Alternatively, the gas pipe 35 may be connected to a flexible body type valve similar to the valve 32c described in FIG. 5A. A fastening member and a flexible member may be added into the valve 32a and the valve 32b.

Figure 13:
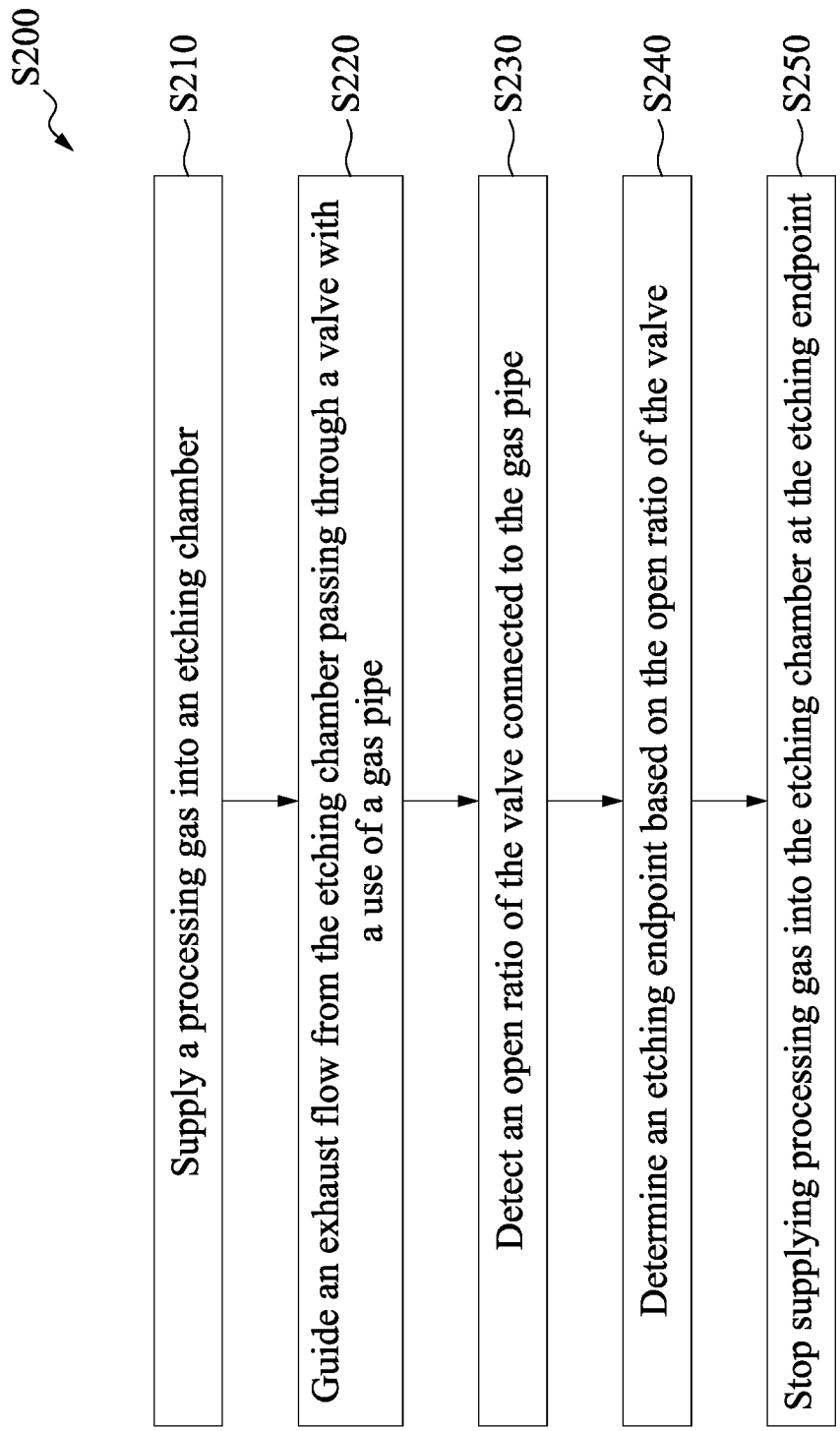
FIG. 13 shows a flow chart illustrating a method for processing a semiconductor wafer in a wafer fabricating system, in accordance with some embodiments.

FIG. 13 is a flow chart illustrating a method S200 for processing semiconductor wafers 5 by the processing tool 10c, in accordance with some embodiments. For illustration, the flow chart will be described along with the drawings shown in FIGS. 2, 8, 9, 11 and 12. Additional operations can be provided before, during, and after the method S200, and some of operations described can be replaced or eliminated for other embodiments of the method.

The method S200 begins with operation S210, in which a processing gas 41 is supplied into an etching chamber 11 for a chemical dry etching process. In some embodiments, prior to operation S210, the semiconductor wafer 5 is moved into the etching chamber 11 by a robot 6 (see FIG. 1) and placed on the wafer chuck 12, as show in FIG. 2. In some embodiments, as shown in FIG. 8, a thin film of material 51 is formed on the semiconductor wafer 5. The thin film of material 51 on the semiconductor wafer 5 includes, but not limited to, metals, silicon dioxide, tungsten, silicon nitride, silicon oxynitride, and various dielectrics. In one exemplary embodiment, the thin film of material 51 on the semiconductor wafer 5 includes Molybdenum (Mo). In some embodiments, a hard mask 52 is formed on the thin film of material 51. The hard mask 52 may include silicon oxide film, and the silicon nitride film in the hard mask 52 may be patterned by etching. The hard mask 52 is patterned by lithography and etching process, and the thin film of material 51 uses the patterned hard mask 52 as an etch mask.

In some embodiments, to supply the processing gas 41 into the etching chamber 11, the gas controller 14, upon receiving instructions from the control module 90, is opened so as to connect the gas source 7 to the etching chamber 11 and direct a desired processing gas through a showerhead 13 into the etching chamber 11. The processing gas 41, as shown in FIG. 8, is reacted with the thin film of material 51 on the semiconductor wafer 5, and a byproduct gaseous material 42 is produced.

The method S200 also includes operation S220, in which an exhaust flow 43 from the etching chamber 11 is guided by the gas pipe 35. In some embodiments, the door 38 is driven to open the end of the gas pipe 35 so as to allow exhaust flow 43 entering the gas pipe 35. The exhaust flow 43 entering the gas pipe 35 consecutively passes through the upstream segment 351, the valve 36, the downstream segment 352 and the downstream segment 312 and is evacuated by the pump 34.

In some embodiments, operation S220 is initiated after operation S210 is performed for a predetermined time period. For example, in a graph shown in FIG. 10, operation S120 may be initiated at time T1. The time T1 may be determined according to experiences data which tells a flow rate of the exhaust flow 43 may become unstable. Alternatively, the time T1 may be determined based on an estimated time T3 at which the etching process is estimated to be finished. The time T1 may be in a range of 80% to about 90% of the time T3. In some embodiments, the door 38 will not opened until the time T1.

The method S200 also includes operation S230, in which the open ratio of the valve 36 is detected. In some embodiments, the open ratio of the valve 36 is proportional to a rotation angle of the disc 323, and the rotation angle of the disc 323 can be calculated by measuring a rotation angle of the shaft 322 with the use of the measuring device 325.

In some embodiments, in order to improve etching uniformity, the gas pressure (P) in the etching chamber 11 is stably controlled at a constant. Therefore, the volume flow rate of the exhaust flow 43 in the gas pipe 35 varies in relation to the change in the numbers of moles of gaseous component in the etching chamber 11. In addition, when the shaft 322 is disengaged from the driving device 329, an open ratio of the valve 36 is varied according to a change of the volume flow rate of the exhaust flow 43 in the gas pipe 35. As a result, an etching endpoint can be determined by a measurement of an open ratio of the valve 36 in cases where a stoichiometric number of the processing gas for an etching process is different from a sum of stoichiometric numbers of gaseous product components.

One example to determine an etching endpoint based open ratio of the valve 36 is illustrated accompanying with the graph of FIG. 10 which demonstrates a change of open ratio of the valve 36 versus processing time during an etching process conducted according to above chemical equation (1) in an experimental data. The etching process shown in FIG. 10 initiates at time T0. At the beginning of the etching process (from time T0 to time T1), as shown in FIG. 8, the processing gas 41 stably reacts with the material 51 and produce a byproduct gaseous material 42. Therefore, the numbers of moles of the exhaust flow 43 in the gas pipe 35 maintains at substantially the same level, and the valve 36 is kept having an open ratio R1.

In a subsequent time period, for example, the time period between T1 and T2, a partial element underlying the thin film of material 51 is exposed to the processing gas 41, which causes a decrease in the numbers of moles of the exhaust flow 43 in the gas pipe 35. Therefore, the open ratio R1 of the valve 36 gradually decreases to open ratio R2 during the time period between T1 and T2 based on the change in the numbers of moles of the exhaust flow 43 in the gas pipe 35.

In a subsequent time period, for example, the time period between T2 and T3 since the thin film of material 51 exposed by the recess 520 is almost all reacted with the processing gas 41, the amount of the byproduct gaseous material 42 is decreased dramatically, which causes a sharp drop of the numbers of moles of the exhaust flow 43 in the gas pipe 35. Therefore, the open ratio R2 of the valve 36 accordingly decreases to open ratio R3 during the time period between T2 and T3 based on the change in the numbers of moles of the exhaust flow 43 in the gas pipe 35.

In some embodiments, after time T3; since the thin film of material 51 exposed by the recess 520 is consumed and the opening 510 is formed, the etching chamber 11 is filled with the processing gas 41, and no more or very few amounts of byproduct gaseous material 42 is left in the etching chamber 11. Therefore, the numbers of moles of the exhaust flow 43 in the gas pipe 35 maintains at substantially the same level, and the valve 36 is kept having an open ratio R3.

The method S200 continues with operation S240, in which an etching endpoint is determined based on the open ratio of the valve 32. In some embodiments, the etching process is ended at the etching endpoint, and the etching endpoint is determined by an open ratio of the valve 36. In the cases where etching process of equation (1) is performed in the processing tool 10c shown in FIG. 11, a measurement of the open ratio of the valve 36 equal to the open ratio R3 (see FIG. 10) indicates an etching endpoint occurs. The open ratio R3 may be derived from experience and empirical data correlated with the thickness and property of the thin film of material 51 being processed.

The method S200 continues with operation S250, in which the supply of the processing gas 41 into the etching chamber 11 is stopped at the etching endpoint. In some embodiments, once the control module 90 detects that the measurement of the open ratio of the valve 36 is equal to a predetermined value, such as open ratio R3 shown in FIG. 10, the control module 90 outputs a control signal to the gas controller 14 to stop the supply of the processing gas 41 into the etching chamber 11. In some embodiments, after the supply of the processing gas 41 is stopped, a nitrogen gas may be purged into the etching chamber 11 and removed by the gas exhausting module 30 to remove the hazardous gas in the etching chamber 11. The semiconductor wafer 5 is then removed from the processing tool 10c.

The semiconductor wafer 5 removed from the processing tool 10c may undergo additional processes including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the substrate, and a pattern is formed in one or more of the layers.

Embodiments of a wafer fabricating system use a gas exhausting module to create an exhaust flow from an etching chamber. Since he numbers of moles of the exhaust flow in the gas exhausting module is correlated to the processing time of the etching process, consequently the etching endpoint can be determined by monitoring an open ratio of the valve of the gas exhausting module. As a result, the etching process can be stop as soon as the target material is consumed, and a tool availability of the etching chamber is increased. In addition, precisely controlling the etching process also saves the usage of processing gas and helps with cost savings indirectly.

In accordance with some embodiments, a method for processing semiconductor wafer is provided. The method includes supplying a processing gas into an etching chamber containing a semiconductor wafer. The method also includes detecting a pressure in the etching chamber. The method further includes regulating an exhaust flow from the etching chamber by adjusting an open ratio of a valve according to a data in relation to a pressure in the etching chamber produced by the pressure sensor. In addition, the method includes determining an etching endpoint based on the open ratio of the valve. In some embodiments, the open ratio of the valve is decreased at the etching endpoint in cases where a stoichiometric number of the processing gas is less than a sum of stoichiometric numbers of gaseous product components. Alternatively, the open ratio of the valve is increased at the etching endpoint in cases where a stoichiometric number of the processing gas is greater than a sum of stoichiometric numbers of gaseous product components. In some embodiments, the regulating the exhaust flow from the etching chamber is initiated after the supplying of the processing gas into the etching chamber is performed for a time period. In some embodiments, the method further includes terminating the supplying the processing gas into the etching chamber at the etching endpoint. In some embodiments, a process performed in the etching chamber is a chemical dry etching.

In accordance with some embodiments, a method for processing semiconductor wafer is provided. The method includes supplying a processing gas into an etching chamber. The method also includes guiding an exhaust flow from the etching chamber passing through a valve, wherein an open ratio of the valve is proportional to a flow rate of the exhaust flow. The method further includes detecting the open ratio of the valve. In addition, the method includes determining an etching endpoint based on the open ratio of the valve. In some embodiments, the open ratio of the valve is decreased at the etching endpoint in cases where a stoichiometric number of the processing gas is less than a sum of stoichiometric numbers of gaseous product components. Alternatively, the open ratio of the valve is increased at the etching endpoint in cases where a stoichiometric number of the processing gas is greater than a sum of stoichiometric numbers of gaseous product components. In some embodiments, the detecting the open ratio of the valve is initiated after the supplying of the processing gas into the etching chamber is performed for a time period. In some embodiments, the exhaust flow is guided to the valve through a gas pipe, and the method further includes moving a door which covers an end of the gas pipe to allow the exhaust flow entering into the gas pipe. In some embodiments, the method further includes terminating the supplying the processing gas into the etching chamber at the etching endpoint. In some embodiments, a process performed in the etching chamber is a chemical dry etching. In some embodiments, the detecting the open ratio of the valve comprises measuring a rotation angle of a disc of the valve. In some embodiments, the detecting the open ratio of the valve comprise measuring a height of a disc of the valve relative to a bottom surface of a channel of the valve. In some embodiments, the method further includes exhausting gaseous material in the etching chamber through an additional gas pipe; detecting a pressure in the etching chamber; and regulating an exhaust flow from the etching chamber by adjusting an open ratio of an addition valve that connected to the additional gas pipe.

In accordance with some embodiments, a wafer fabricating system for processing semiconductor wafer is provided. The wafer fabricating system includes an etching chamber and a gas source fluidly connected to the etching chamber. The wafer fabricating system also includes a gas controller connected between the etching chamber and the gas source. The wafer fabricating system further includes a first gas pipe and a first valve. The first gas pipe is connected to the etching chamber for guiding a flow of an exhaust flow from the etching chamber. The first valve is connected to the first gas pipe. In addition, the wafer fabricating system includes a control module. The control module is electrically connected to gas controller and the first valve and configured to detect an open ratio of the first valve; determine an etching endpoint based on the open ratio of the first valve; and control the gas controller to terminate a supply of the processing gas into the etching chamber at the etching endpoint. In some embodiments, the system further includes a pressure sensor positioned in the etching chamber, wherein the control module is further configured to control an open ratio of the first valve according to a data in relation to a pressure in the etching chamber produced by the pressure sensor. In some embodiments, the system further includes a second gas pipe connected to the etching chamber for allowing an exhaust flow from the etching chamber and a second valve. The second valve includes a channel; a disc located in the channel; a shaft connected to the disc; and a flexible member connected to the shaft to provide a retract force to close the second valve after the disc is rotated by the exhaust flow from the etching chamber. In some embodiments, the first gas pipe and the second gas pipe are connected to different positions of the etching chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a semiconductor wafer, comprising:
   supplying a processing gas into an etching chamber containing a semiconductor wafer;
   detecting a pressure in the etching chamber;
   regulating an exhaust flow from the etching chamber by adjusting an open ratio of a single valve according to a data in relation to a pressure in the etching chamber; and
   terminating the supplying the processing gas into the etching chamber based on the open ratio of the single valve, wherein the open ratio of the single valve is greater than 0 and less than 1.

2. The method as claimed in claim 1, wherein the open ratio of the single valve is decreased in cases where a stoichiometric number of the processing gas is less than a sum of stoichiometric numbers of gaseous product components.

3. The method as claimed in claim 1, wherein the open ratio of the single valve is increased in cases where a stoichiometric number of the processing gas is greater than a sum of stoichiometric numbers of gaseous product components.

4. The method as claimed in claim 1, wherein the regulating the exhaust flow from the etching chamber is initiated after the supplying of the processing gas into the etching chamber is performed for a time period.

5. The method as claimed in claim 1, wherein a process performed in the etching chamber is a chemical dry etching.

6. A method for processing a semiconductor wafer, comprising:
   supplying a processing gas into an etching chamber;
   guiding an exhaust flow from the etching chamber passing through a valve, wherein an open ratio of the valve is proportional to a flow rate of the exhaust flow;
   detecting the open ratio of the valve; and
   determining an etching endpoint based on a predetermined value of the open ratio of the valve, wherein the predetermined value of the open ratio is greater than 0 and less than 1.

7. The method as claimed in claim 6, wherein the open ratio of the valve is decreased at the etching endpoint in cases where a stoichiometric number of the processing gas is less than a sum of stoichiometric numbers of gaseous product components.

8. The method as claimed in claim 6, wherein the open ratio of the valve is increased at the etching endpoint in cases where a stoichiometric number of the processing gas is greater than a sum of stoichiometric numbers of gaseous product components.

9. The method as claimed in claim 6, wherein the detecting the open ratio of the valve is initiated after the supplying of the processing gas into the etching chamber is performed for a time period.

10. The method as claimed in claim 6, wherein the exhaust flow is guided to the valve through a gas pipe, and the method further comprises:
    moving a door which covers an end of the gas pipe to allow the exhaust flow entering into the gas pipe.

11. The method as claimed in claim 6, further comprising terminating the supplying the processing gas into the etching chamber at the etching endpoint.

12. The method as claimed in claim 6, wherein a process performed in the etching chamber is a chemical dry etching.

13. The method as claimed in claim 6, wherein the detecting the open ratio of the valve comprises measuring a rotation angle of a disc of the valve.

14. The method as claimed in claim 6, wherein the detecting the open ratio of the valve comprises measuring a height of a disc of the valve relative to a bottom surface of a channel of the valve.

15. The method as claimed in claim 6, further comprising:
    exhausting gaseous material in the etching chamber through an additional gas pipe;
    detecting a pressure in the etching chamber; and
    regulating an exhaust flow from the etching chamber by adjusting an open ratio of an addition valve that connected to the additional gas pipe.

16. A wafer fabricating system, comprising:
    an etching chamber;
    a gas source fluidly connected to the etching chamber;
    a gas controller connected between the etching chamber and the gas source;
    a first gas pipe connected to the etching chamber for guiding a flow of an exhaust flow from the etching chamber;
    a first valve connected to the first gas pipe;
    a second gas pipe connected to the etching chamber for allowing an exhaust flow from the etching chamber;
    a door disposed on a sidewall of the etching chamber, between the first and second gas pipes, and being movable to cover the second gas pipe; and
    a control module electrically connected to gas controller and the first valve and configured to:
       detect an open ratio of the first valve;
       determine an etching endpoint based on the open ratio of the first valve; and
       control the gas controller to terminate a supply of a processing gas into the etching chamber at the etching endpoint.

17. The wafer fabricating system as claimed in claim 16, further comprising a pressure sensor positioned in the etching chamber, wherein the control module is further configured to control an open ratio of the first valve according to a data in relation to a pressure in the etching chamber produced by the pressure sensor.

18. The wafer fabricating system as claimed in claim 16, wherein the control module is further configured to control the gas controller to terminate the supply of the processing gas into the etching chamber based on a predetermined value of the open ratio of the first valve, wherein the predetermined value of the open ratio is greater than 0 and less than 1.

19. The wafer fabricating system as claimed in claim 16, further comprising:
    a second valve connected to the second gas pipe and comprising:
       a channel;
       a disc located in the channel;
       a shaft connected to the disc; and
       a flexible member connected to the shaft to provide a retract force to close the second valve after the disc is rotated by the exhaust flow from the etching chamber.

20. The wafer fabricating system as claimed in claim 19, wherein the first gas pipe and the second gas pipe are connected to different positions of the etching chamber.

* * * * *